United States Patent

O'Bryan, Jr. et al.

[11] Patent Number: 5,932,905
[45] Date of Patent: Aug. 3, 1999

[54] ARTICLE COMPRISING A CAPACITOR WITH NON-PEROVSKITE SR-BA-TI OXIDE DIELECTRIC THIN FILM

[75] Inventors: Henry Miles O'Bryan, Jr., Plainfield, N.J.; Jeffrey Frederick Roeder, Brookfield; Gregory T. Stauf, New Milford, both of Conn.; Roderick Kent Watts, Summit, N.J.

[73] Assignees: Lucent Technologies Inc., Murray Hill, N.J.; Advanced Technology Materials, Inc.

[21] Appl. No.: 08/979,684

[22] Filed: Nov. 26, 1997

[51] Int. Cl.$^6$ .................................................. H01L 27/148
[52] U.S. Cl. ........................ 257/298; 257/333; 257/545; 257/386; 257/388; 257/532; 257/533; 257/906
[58] Field of Search ..................... 257/296, 545, 257/333, 340, 386, 387, 388, 389, 532, 533, 534, 535, 906, 924; 427/226; 501/137; 438/3

[56] References Cited

U.S. PATENT DOCUMENTS 5,635,420 6/1997 Nishioka ...................................... 438/3
5,645,634 7/1997 Ogi et al. .................................. 427/226

OTHER PUBLICATIONS

"MOCVD BaSrTiO$_3$ for $\geq$ 1–Gbit DRAMS", by S. M. Bilodeau et al., *Solid State Technology*, Jul. 1997, pp. 235–242.

"Growth and Characterization of Thin Film Dielectrics For Microwave Applications", by H. M. O'Bryan et al., *Integrated Ferroelectrics*, vol. 15, pp. 155–162.

"Synthesis and Characterization of Alkaline–Earth–Metal β–Diketonate Complexes Used as Precursors for Chemical Vapor Deposition of Thin–Film Superconductors", by S. B. Turnipseed et al., *Inorganic Chemistry*, vol. 30, No. 6, 1991, pp. 1164–1170.

"MOCVD of BaSrTiO$_3$ for ULSI DRAMS", by P. Kirlin et al., *Integrated Ferroelectrics*, vol. 7, pp. 307–318.

*Primary Examiner*—Carl Whitehead, Jr.
*Attorney, Agent, or Firm*—Eugen E. Pacher

[57] ABSTRACT

Ba—Sr—Ti-oxide dielectric material, with at least 60 atomic percent of the total content of the oxide being Ti, can have relatively high dielectric constant K (>40 at 20° C.) and relatively low second order voltage coefficient $a_2$ of the dielectric constant ($a_2$ <100 PPM V$^2$ at 20° C.). In preferred embodiments the dielectric material has nominal composition (BA$_x$Sr$_y$Ti$_{1-x-y}$)-oxide, with 1—x—y in the range 0.65–0.90, with both x and y greater than or equal to 0.05. Ba, Sr and Ti together typically comprise at least 99 atomic percent of the total metal content of the dielectric material.

3 Claims, 2 Drawing Sheets

ARTICLE COMPRISING A CAPACITOR WITH NON-PEROVSKITE SR-BA-TI OXIDE DIELECTRIC THIN FILM

GOVERNMENT CONTRACT

This invention was made with Government support under Contract No. F33615-94-C-2508. The Government has certain rights in this invention.

FIELD OF THE INVENTION

This invention pertains to capacitors with Ba—Sr—Ti-oxide dielectric, to integrated circuit chips comprising such capacitors, and to a method of making the capacitors.

BACKGROUND

Discrete capacitors are frequently used in communication circuits and other high-frequency circuits. However, it would be desirable if thin film capacitors could be used instead of discrete ones, especially if the former could be integrated with the circuitry on an IC chip.

Among the (actual or potential) applications for integrated capacitors are DRAM storage capacitors, feedthrough capacitors, bypass capacitors, capacitors for RC filters, and capacitors for switched capacitor filters. For DRAM storage capacitors, large specific capacitance and low leakage current are important requirements. For the other listed applications, large specific capacitance is also important, although it generally need not be as large as for DRAM applications. Among other important considerations for capacitors for non-DRAM applications are low leakage current, high breakdown field, small loss tangent (or large quality factor), and small variation of the capacitance with temperature. At least for those applications that require very low harmonic distortion or intermodulation distortion, low dependence of the capacitance on the applied voltage is very important.

Recently it was discovered that thin film capacitors with perovskite $Ba_{1-x}Sr_xTiO_3$ dielectric can have high specific capacitance. See, for instance, S. M. Bilodeau et al., *Solid State Technology*, July 1997, p. 235. However, the capacitors have relatively large voltage dependence of the dielectric constant K that makes them unsuitable for at least some important applications. As is well known, perovskites have composition $ABO_3$, where A and B are crystallographically inequivalent.

Recently it was also discovered that capacitors with non-perovskite dielectric of composition $Ba_2Ti_9O_{20}$ can have low dependence of the capacitance on the applied voltage. Exemplarily, the quadratic coefficient $a_2$ is less than 100 ppm/V². The coefficients $a_1$ and $a_2$ are defined by the expression $\Delta C/C = a_1 V + a_2 V^2$, where C is capacitance, $\Delta C$ is a change in the value of the capacitance, and V is applied voltage. The linear term $a_1$ can be cancelled by means of a differential circuit, but the quadratic term $a_2$ has to be minimized by materials choice. The above referred to capacitors with $Ba_2Ti_9O_{20}$ dielectric have relatively low specific capacitance, exemplarily only about 5% of that of the perovskite $Ba_{1-x}Sr_xTiO_3$. See H. M. O'Bryan et al., *Integrated Ferroelectrics*, Vol. 15, p. 155 (1997), and U.S. patent application Ser. No. 08/617,976.

It clearly would be desirable to have available integrated capacitors that have low voltage dependence of K, comparable to that of non-perovskite $Ba_2Ti_9O_{20}$ (i.e., $a_2 < 100$ ppm/V²), and that have higher K (and thus have higher specific capacitance) than is attainable with $Ba_2Ti_9O_{20}$ (e.g., K greater than 40). This application discloses such integrated capacitors. The capacitors are advantageously used in, for instance, switched capacitor filters (SCF) and other applications that require capacitors with relatively high specific capacitance and low voltage dependence of K.

SUMMARY OF THE INVENTION

In a broad aspect the invention is embodied in an article (e.g., an integrated circuit chip) that comprises an improved thin film capacitor disposed on a substrate. The capacitor comprises a first and a second electrode, with a thin film of oxide dielectric material disposed between the electrodes.

The dielectric is a Ba—Sr—Ti-oxide, with at least 60 atom % (of the total metal content) being Ti. The oxide has dielectric constant $K > 40$ and a second order voltage coefficient $a_2 < 100$ ppm/V², both at 20° C. In currently preferred embodiments the oxide has nominal composition $(Ba_xSr_yTi_{1-x-y})$-oxide, with 1—x—y in the range 0.65–0.90, and with both x and y greater than or equal to 0.05.

It will be appreciated that, in a parallel plate capacitor, specific capacitance is directly related to the dielectric constant of the dielectric layer. The discussion below will generally be in terms of the dielectric constant K, since this parameter is thickness-independent, whereas specific capacitance requires specification of the thickness of the dielectric.

The invention is also embodied in a method of making an article that comprises an integrated capacitor (i.e., a thin film capacitor) that comprises providing a substrate, forming a first electrode on the substrate, and depositing on the first electrode a layer of Ba—Sr—Ti-oxide, with at least 60 atom % (of the total metal content) being Ti. After attainment of the desired oxide thickness a second electrode is formed on the oxide. In currently preferred embodiments the oxide deposition conditions are selected such that the oxide has nominal composition $(Ba_xSr_yTi_{1-x-y})$-oxide, with 1—x—y in the range 0.65–0.90, with both x and y greater than or equal to 0.05. Ba, Sr and Ti together typically comprise at least 99 atomic percent of the total metal content of the dielectric material.

The oxygen content typically depends on the metal ion content and frequently exceeds 60% of the total number of atoms of the material.

The discovery that the above-defined oxides can have relatively high dielectric constant and low $a_2$ is surprising, in view of the substantial amount of work that had previously been directed at the titanates which failed to provide any indication that it might be possible to attain such improved properties.

BRIEF DESCRIPTION OF THE DRAWINGS

FIGS. 1 and 4 are not to scale or in proportion.

DETAILED DESCRIPTION

Figure 1:
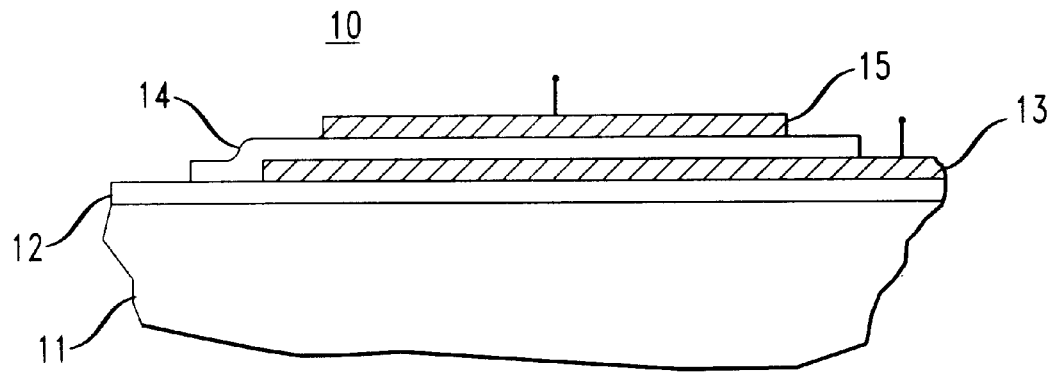
FIG. 1 schematically depicts an exemplary article according to the invention.

The titanate films that are described below were deposited on Si substrates, typically with a sputter-deposited Pt bottom electrode on a $SiO_2$ barrier layer. Ta barriers were also used but were generally found to be unsuitable for deposition temperatures above 600° C.

Subsequent to bottom electrode deposition, the titanate was deposited by metal-organic chemical vapor deposition (MOCVD). This deposition method was selected because, inter alia, it facilitates microstructure control, can be implemented to provide large throughput, can be scaled up to large areas, and provides a conformal deposit. However, practice of the invention is not limited to the use of MOCVD, and the use of other deposition techniques (e.g., sputtering, laser ablation, evaporation, or other type of CVD) is contemplated.

Barium bis (2,2,6,6-tetramethyl-3,5-heptanedionate) .Lewis base adduct (polyamine), to be referred to as $Ba(thd)_2$, and strontium bis (2,2,6,6-tetramethyl-3,5-heptanedionate).Lewis base adduct (polyamine), to be referred to as $Sr(thd)_2$, were used as the Group II metal source reagents. Titanium bis (isopropoxide) bis (2,2,6,6-tetramethyl-3,5-heptanedionate), to be referred to as $Ti(OCH(CH_3)_2)_2(thd)_2$, was used as the titanium precursor. Although these compounds are commercially available, they were synthesized in-house by known non-aqueous routes to obtain good stability and purity. Of course, other precursor compounds can be used if desired.

$Ba(thd)_2$ and $Sr(thd)_2$ have a relatively narrow temperature window in which they sublime and remain thermally stable. See, for instance, S. B. Turnispeed et al., *Inorganic Chemistry*, Vol. 30, p. 1164 (1991). For this reason, film growth was carried out in a MOCVD reactor that was fitted with a liquid delivery system that injects the precursor compounds, dissolved in an organic solvent (e.g., n-butyl acetate polyamine), into a hot vaporizer, where they are flash vaporized into an Ar carrier gas stream for transport to the reactor.

The reactor was a commercially available reactor, modified for use with low vapor pressure precursors, and designed to give uniform films over 6 inch diameter substrates. The reactor was operated at low pressure (e.g., 700 mTorr), with 500 sccm each of oxygen and nitrous oxide as oxidizers. See, for instance, P. Kirlin et al., *Integrated Ferroelectrics*, Vol. 7, p. 307 (1995).

Exemplary growth conditions were as follows:

| | |
|---|---|
| Deposition Temperature | 540–640° C. |
| Reactor Pressure | 700 mTorr |
| Deposition Rate | 3–4 nm/minute |
| Substrate | $Pt/SiO_2/Si$ |
| Ar Flow Rate | 200 sccm |
| $O_2$ Flow Rate | 500 sccm |
| $N_2O$ Flow Rate | 500 sccm |

The thin film capacitors described herein exemplarily were made as follows. On a conventional Si wafer (4 or 6 inch diameter) was deposited a $SiO_2$ barrier layer (100–400 nm thick) by conventional wet oxidation over the whole wafer surface. Onto the $SiO_2$ barrier layer was deposited a Pt layer (exemplarily 100 nm thick) by conventional sputtering. The Pt layer also extended over the whole wafer surface and served as the bottom electrode. Onto the Pt layer was deposited a thin film (typically 40 nm) of the titanate according to the invention by MOCVD, as described above. The titanate film also extended over the whole wafer surface. Top electrodes were formed on the titanate layer by e-beam evaporation of about 100 nm Pt through a shadow mask at about 200° C. After top electrode deposition, the wafers were annealed at 550° C. for 30 minutes in air. The anneal typically resulted in more symmetric I/V characteristics, with lower leakage currents under both positive and negative applied voltages, and in lower dielectric loss.

It will be understood that the above recited conditions are exemplary only, and that other conditions (e.g., different layer thicknesses, different deposition or anneal temperatures, different deposition methods) could be used.

For instance, the top electrode could be Al, in contrast with prior art capacitors with perovskite Ba—Sr—Ti-oxide dielectric, which exhibited shorting when Al top electrodes were used. It will also be understood that the described capacitor structure was used for experimental reasons, but that in actual applications the dielectric layer (and possibly also the bottom electrode) would be patterned, exemplarily as schematically shown in FIG. 1, wherein numerals 10–15 refer, respectively, to an integrated (thin film) capacitor, Si substrate, diffusion barrier layer, bottom electrode, titanate dielectric, and top electrode.

Figure 2:
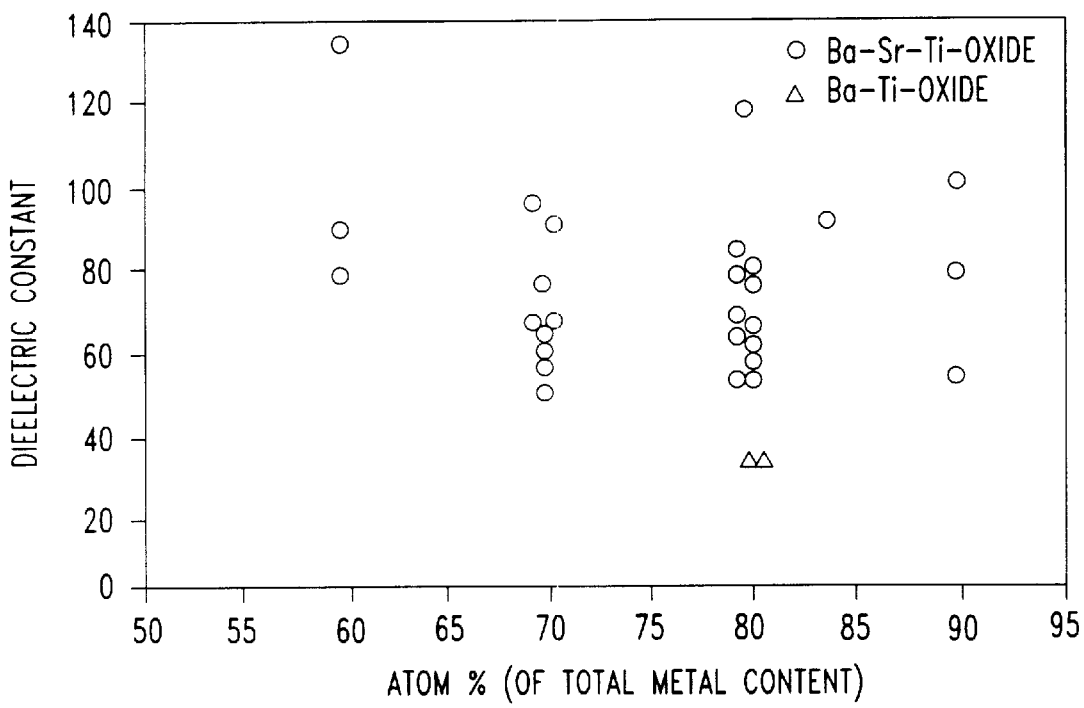
FIGS. 2 and 3 show data on dielectric constant vs. mol % Ti.

FIG. 2 shows data on dielectric constant K vs. Ti atom %. The circles pertain to Ba—Sr—Ti-oxide, and the triangles to Ba—Ti-oxide. As the data show, partial substitution of Sr for some Ba can result in significantly increased dielectric constant. The compositions of FIG. 2 generally have $a_2<100$ $ppm/V^2$, and thus exemplarily can meet the requirements for use in switched capacitor filters. However, the materials corresponding to the data points with less than 60%, or more than 90%, Ti content have relatively large $a_2$, and are generally unsuitable for that reason.

For the sake of clarity, FIG. 2 does not show all data points for the Ba—Sr—Ti-oxide. We have observed that these compositions exhibit a bimodal distribution with respect to the dielectric constant, but have not yet succeeded in elucidating the reason for this distribution. However, it is anticipated that further research will enable us to eliminate the low-K members of the Ba—Sr—Ti-oxide compositions.

Figure 3:
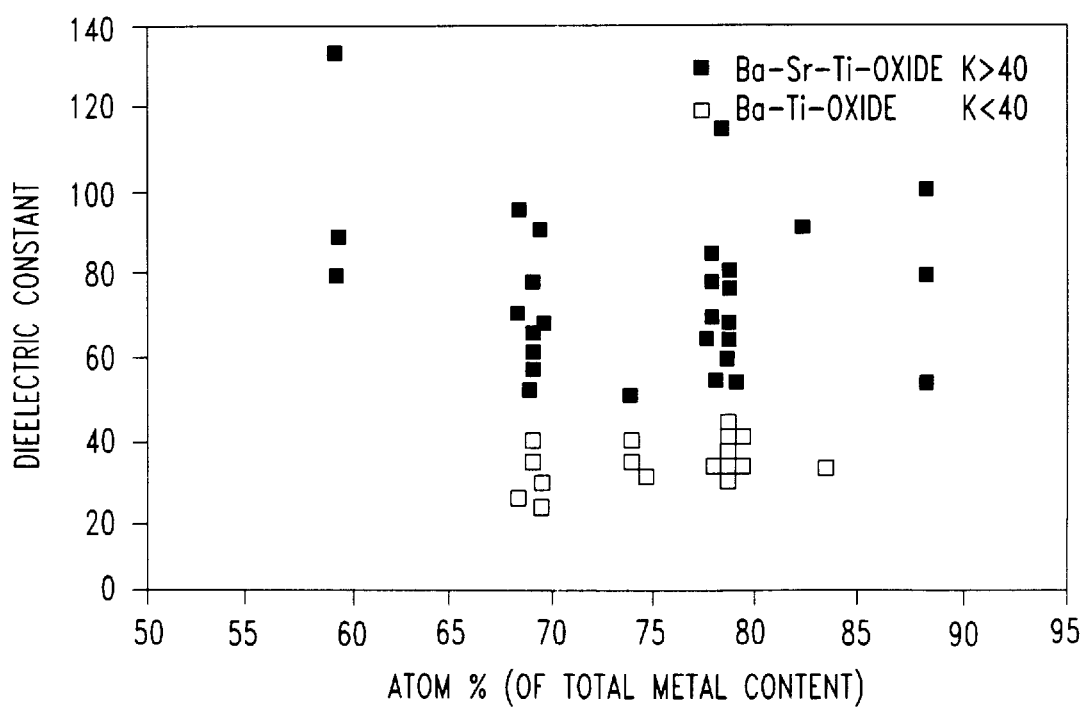

FIG. 3 shows dielectric constant vs. Ti content, for various Ba—Sr—Ti-oxide samples, and clearly shows the bimodal distribution, with the solid squares pertaining to compositions with K>40, and the open squares pertaining to compositions with K≦40. Selection of samples having K>40 can readily be made using conventional techniques.

Capacitors according to the invention can be used in substantially the same manner in which prior art integrated capacitors are used, taking into account the improved properties. For instance, the higher dielectric constant of capacitors according to the invention facilitates size reduction of the capacitors, resulting in saving of "real estate" on an IC chip.

Figure 4:
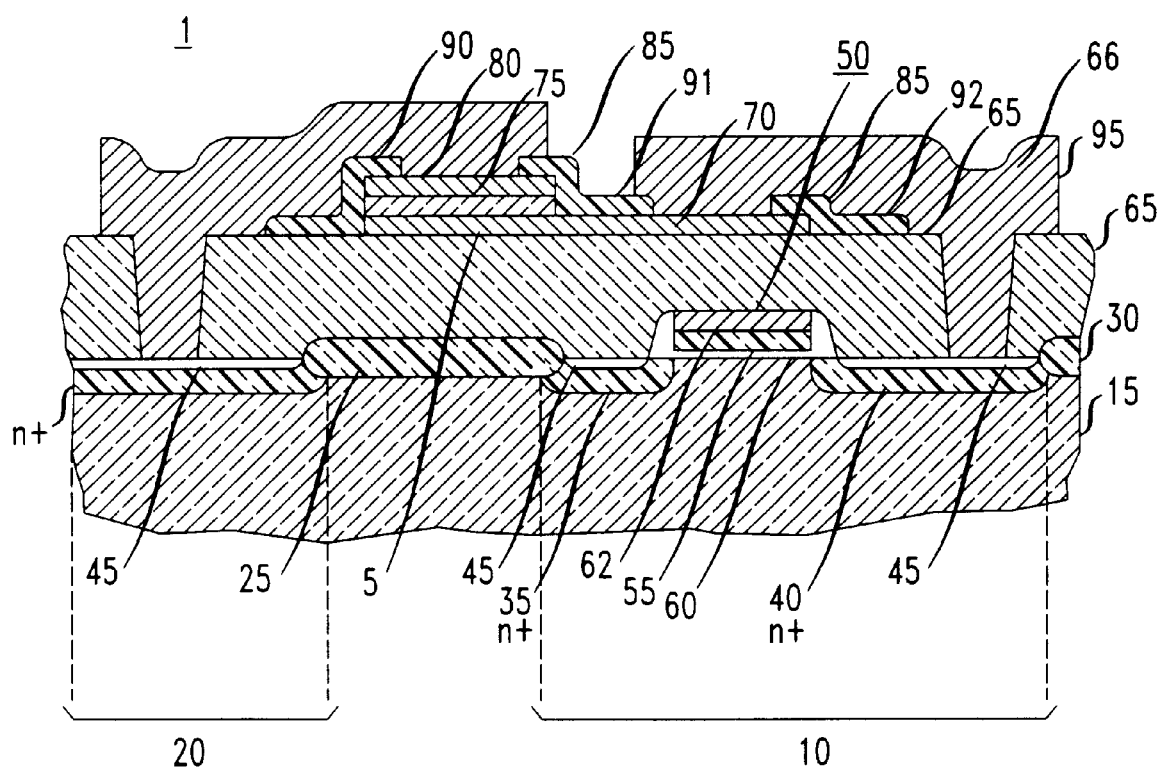
FIG. 4 schematically depicts a portion of an IC with an integrated capacitor according to the invention.

FIG. 4 schematically shows a portion of an exemplary IC with an integral capacitor. The illustrated portion of integrated circuit 1 includes a first active device 10, such as a conventional metal-oxide-semiconductor field effect transistor (MOSFET), and a capacitor 5 employing a dielectric film layer of Ba—Sr—Ti-oxide formed on a substrate 15, such as a silicon substrate. A drain region of a second transistor 20 is also shown. The particular types of active devices employed, e.g., NMOS, PMOS or CMOS, are based on the desired operation of the integrated circuit and are not critical for practicing the present invention. Other suitable active devices include, for example, bipolar junction transistors and GaAs MESFETs. The transistors 10 and 20 can be fabricated, for example, by conventional processing methods. In FIG. 4, the transistors 10 and 20 include field oxide regions 25 and 30 which are formed, for example, by $SiO_2$ and operate as insulators between the transistor 10 and adjacent devices, such as the transistor 20. Source and drain regions 35 and 40 of the transistor 10 are formed by doping with n-type impurities, such as arsenic or phosphorus for NMOS. An optional layer of silicide 45 is deposited over the source and drain regions 35 and 40 to reduce the source and drain resistance, which enables greater current delivery by the transistor 10.

A gate 50 of the transistor 10 includes, for example, polysilicon 55 doped with an n-type impurity, such as by an implant or vapor doping. The gate polysilicon 55 is disposed on a $SiO_2$ spacer 60. An optional layer of silicide 62 is also deposited over the gate polysilicon 55 to reduce the electrical resistance of the gate 50. An insulating layer 65 of, for example, P-glass which is an oxide doped with phosphorus is then deposited on the transistors 10 and 20 to provide protection to the transistors 10 and 20 and to facilitate electrical connection. Contact windows 66 are then etched in the insulating layer 65 to expose the device gate 50 and source and drain regions, such as the regions 35 and 40. Although only the drain regions of the transistors 10 and 20 are exposed in the cross-section of the integrated circuit illustrated in FIG. 4, it should be readily understood that the gate and source are exposed at other areas of the integrated circuit 1 that are outside the illustrated cross-section.

In typical prior art integrated circuit fabrication methods, an electrically conductive interconnection layer, would then be deposited on the surface of the insulating layer 65 in specific patterns to electrically connect devices via the etched regions and other circuit components in the desired manner. However, in accordance with the present invention, at least one capacitor, such as the capacitor 5 shown in FIG. 4, is formed on the integrated circuit, such as on the insulating layer surface.

The capacitor 5 includes a first electrode 70 formed on the insulating layer surface, a dielectric thin film region 75 on the first electrode 70, and a second electrode 80 formed on the dielectric film region 75 opposite the first electrode 70. It is possible for the first electrode 70 to have a two layer structure. Such a structure is, for example, a layer of platinum formed over a layer of Ti-nitride. Platinum is a suitable electrode material, however, it adversely chemically reacts with silicon. As a consequence, a diffusion barrier is employed as the second electrode layer which is in contact with the insulating layer surface to substantially prevent a chemical reaction between the platinum and the silicon of the substrate 15. Suitable thicknesses for each layer of the two layer structure are in the range of 0.01 to 0.5 $\mu$m.

It is further possible for the first electrode 70 to be a single layer structure of an appropriate conductive material. Overall suitable thicknesses for the first electrode 70, whether a one or two layer structure, are in the range of approximately 0.1 to 0.5 $\mu$m. Thicknesses less than 0.1 $\mu$m are undesirable because of its high electrical resistance while thicknesses greater than 0.5 $\mu$m are generally disadvantageous because of high fabrication cost and poor adherence. The first electrode 70 is larger than the second electrode 80 to provide electrical connection to the first electrode 70.

In accordance with the present invention, after formation of the capacitor 5, an insulating material 85, such as, for example, $SiO_2$ is deposited on edge regions 90, 91 and 92 of the capacitor 5 to prevent short circuits between the first and second capacitor electrodes 70 and 80 when the interconnection layer is formed. An interconnection layer 95 is then formed on the insulation layer and corresponding etched contact windows to electrically connect the devices 10 and 20 and the capacitor 5 in a desired manner. Suitable materials for the interconnection layer 95 include aluminum and copper. In the integrated circuit 1, the drain 40 of the transistor 10 is electrically connected to the first electrode 70 of the capacitor 80 and the capacitor's second electrode 80 is electrically connected to the source of the transistor 20.

The invention claimed is:

1. An article comprising a thin film capacitor that comprises a first electrode on a substrate, a layer of oxide dielectric material disposed on the first electrode, and a second electrode disposed on the oxide dielectric material;

CHARACTERIZED IN THAT
a) the oxide dielectric material is non-perovskite Ba—Sr—Ti-oxide, with at least 60 atom % of a total metal content of the oxide being Ti; and
b) the oxide has a dielectric constant K>40 at 20° C., and a second order voltage coefficient $a_2$<100 ppm/$V^2$ at 20°.

2. An article according to claim 1, wherein the Ba—Sr—Ti-oxide has nominal composition $(Ba_xSr_yTi_{1-x-y})$-oxide, wherein 1—x—y is in the range 0.65–0.90, with both x and y greater than or equal to 0.05.

3. An article according to claim 1, wherein the article is an integrated circuit chip comprising a transistor that is electrically connected to one of said first and second electrodes.

* * * * *